(12) United States Patent
Kwon et al.

(10) Patent No.: US 12,308,243 B2
(45) Date of Patent: May 20, 2025

(54) METHOD OF PROCESSING SUBSTRATE HAVING SILICON NITRIDE LAYER

(71) Applicant: TES Co., Ltd, Yongin-si (KR)

(72) Inventors: Bong-Soo Kwon, Yongin-si (KR); Se-Woong Bae, Yongin-si (KR); Eun-Jin Song, Yongin-si (KR)

(73) Assignee: TES CO., LTD, Yongin-si (KR)

( * ) Notice: Subject to any disclaimer, the term of this patent is extended or adjusted under 35 U.S.C. 154(b) by 453 days.

(21) Appl. No.: 17/895,601

(22) Filed: Aug. 25, 2022

(65) Prior Publication Data

US 2023/0073989 A1    Mar. 9, 2023

(30) Foreign Application Priority Data

Aug. 25, 2021    (KR) .......................... 10-2021-0112082

(51) Int. Cl.
*H01L 21/311*    (2006.01)
*H01J 37/32*    (2006.01)
*H01L 21/02*    (2006.01)

(52) U.S. Cl.
CPC .. *H01L 21/31116* (2013.01); *H01J 37/32091* (2013.01); *H01J 37/3244* (2013.01); *H01L 21/02126* (2013.01)

(58) Field of Classification Search
None
See application file for complete search history.

(56) References Cited

U.S. PATENT DOCUMENTS

| | | | |
|---|---|---|---|
| 2013/0089988 A1* | 4/2013 | Wang | .................. H01L 21/3081 438/719 |
| 2015/0099375 A1 | 4/2015 | Haripin et al. | |
| 2020/0098586 A1* | 3/2020 | Xia | .................. H01J 37/32357 |

FOREIGN PATENT DOCUMENTS

| | | |
|---|---|---|
| CN | 104838479 A | 8/2015 |
| KR | 10-2013-0056039 A | 5/2013 |
| KR | 10-2017-0054227 A | 5/2017 |
| KR | 10-2021-0052560 A | 5/2021 |
| TW | 201514332 A | 4/2015 |

OTHER PUBLICATIONS

Taiwanese Office Action for related TW Application No. 111130307 mailed May 9, 2023 from Taiwan Intellectual Property Office.
Korean Office Action for related KR Application No. 10-2021-0112082 mailed Aug. 16, 2023 from Korean Intellectual Property Office.

* cited by examiner

*Primary Examiner* — Roberts P Culbert
(74) *Attorney, Agent, or Firm* — Paratus Law Group, PLLC (57) ABSTRACT

The present invention relates to a substrate processing method for selectively etching a silicon nitride layer on a substrate on which silicon oxide layers and silicon nitride layers are alternately stacked, the method including plasma etching the silicon nitride layers using plasma of a plurality of gases, wherein the plurality of gases include a first gas containing fluorine excluding nitrogen trifluoride ($NF_3$) and a second gas containing hydrogen, and the etch profile in the thickness direction of the silicon nitride layers is controlled by adjusting the atomic ratio of fluorine to hydrogen included in the plurality of gases.

14 Claims, 6 Drawing Sheets

METHOD OF PROCESSING SUBSTRATE HAVING SILICON NITRIDE LAYER

CROSS-REFERENCE TO RELATED APPLICATION

This application claims a benefit under 35 U.S.C. § 119(a) of Korean Patent Application No. 10-2021-0112082 filed on Aug. 25, 2021, on the Korean Intellectual Property Office, the entirety of disclosure of which is incorporated herein by reference for all purposes.

BACKGROUND

1. Field of the Invention

The present invention relates to a substrate processing method. More particularly, the present invention relates to a substrate processing method capable of controlling an etch profile of a silicon nitride layer formed on a substrate.

2. Discussion of Related Art

With the recent miniaturization of semiconductor devices, semiconductor devices are gradually becoming highly integrated. Since a silicon nitride film is used as a dielectric film or an insulating film having chemically stable characteristics, it is widely used not only in a basic device isolation process of a memory devices but also in a DRAM and FLASH memory manufacturing process, such as being used as sidewall materials in a contact process and a capping process.

Meanwhile, in the case of manufacturing a semiconductor device, a silicon oxide film and a silicon nitride film are formed in multilayers on a substrate in some cases. In this case, in order to selectively etch the silicon nitride layers, it is necessary to apply an etchant having a high etching selectivity compared to the silicon oxide layer.

Conventionally, as an etchant having a high etching selectivity compared to a silicon oxide film, a phosphoric acid-based etchant is known. The etching of the silicon nitride film using the phosphoric acid-based etchant corresponds to wet etching. However, wet etching has a problem in that the etchant penetrates into the device pattern due to surface tension, and the etching is not properly performed to the lowermost nitride layer. This problem becomes more severe as the number of layers of the semiconductor device becomes larger and the pattern becomes finer.

Dry etching has been proposed as an alternative to such wet etching. Dry etching is a method in which an etching gas becomes plasma, and the silicon nitride film is etched using etching radicals generated therefrom. As an etching gas used for etching the silicon nitride film, carbon tetrafluoride ($CF_4$), nitrogen trifluoride ($NF_3$), or the like has been suggested.

Meanwhile, hydrogen-containing etching gases such as monofluoromethane ($CH_3F$) and difluoromethane ($CH_2F_2$) are not used well during silicon nitride dry etching because a thick polymer film by hydrogen radicals is produced while the etching gas becomes plasma. Such a thick polymer film lowers the etch rate of the silicon nitride film.

However, when only an etching gas containing no hydrogen is used to suppress the formation of the polymer film, there is a problem in that the etching selectivity of the silicon nitride film with respect to the silicon oxide film is not high, and accordingly, the silicon oxide film is also etched to some extent.

SUMMARY OF THE INVENTION

It is an object of the present invention to provide a substrate processing method capable of selectively etching a silicon nitride layer with respect to the silicon oxide layer while also adjusting the etch profile in the thickness direction of the silicon nitride layers through control of the atomic ratio of fluorine to hydrogen contained in the etching gas, the RF frequency, etc.

A substrate processing method according to embodiment of the present invention to solve the above problems is a method of selectively etching a silicon nitride layer above a substrate comprising alternating layers of silicon oxide layer and silicon nitride layer stacked, the method including plasma etching the silicon nitride layers using plasma of a plurality of gases, wherein the plurality of gases include a first gas containing fluorine excluding nitrogen trifluoride ($NF_3$) and a second gas containing hydrogen, and the etch profile in the thickness direction of the silicon nitride layers is controlled by adjusting the atomic ratio of fluorine to hydrogen included in the plurality of gases.

An atomic ratio of fluorine to hydrogen (F/H) may be about 15:1 to about 35:1.

The first gas is carbon tetrafluoride ($CF_4$), and the second gas may be one or more selected from difluoromethane ($CH_2F_2$), monofluoromethane ($CH_3F$), methane ($CH_4$), hydrogen ($H_2$), ammonia ($NH_3$), and trifluoromethane ($CHF_3$).

The plurality of gases may further include nitrogen and oxygen.

The plasma etching may be performed under a condition of a RF frequency of about 15 MHz or more and less than about 60 MHz.

The plasma etching may be performed in a capacitively coupled plasma (CCP) mode.

A substrate processing method according to another embodiment of the present invention to solve the above problems is a method of selectively etching a silicon nitride layer above a substrate comprising alternating layers of silicon oxide layer and silicon nitride layer stacked, the method including plasma etching the silicon nitride layers using plasma of a plurality of gases such that the etch rate of the uppermost silicon nitride layer and that of the lowermost silicon nitride film are the same or gradually increase the etch rate from the uppermost silicon nitride layer to the lowermost layer of silicon nitride, the plurality of gases include a first gas containing fluorine excluding nitrogen trifluoride and a second gas containing hydrogen, and an atomic ratio of fluorine to hydrogen (F/H) contained in the plurality of gases is about 22.5:1 or more and about 35:1 or less.

A substrate processing method according to another embodiment of the present invention to solve the above problems is a method of selectively etching a silicon nitride layer above a substrate comprising alternating layers of silicon oxide layer and silicon nitride layer stacked, the method including plasma etching the silicon nitride layers using plasma of a plurality of gases such that the etch rate gradually decreases from the uppermost silicon nitride layer to the lowermost silicon nitrate layer, the plurality of gases include a first gas containing fluorine excluding nitrogen trifluoride and a second gas containing hydrogen, and an atomic ratio of fluorine to hydrogen (F/H) contained in the plurality of gases is about 15:1 or more and less than about 22.5:1.

In the substrate processing method according to the present invention, nitrogen trifluoride ($NF_3$) is not included, and a fluorine-containing gas such as carbon tetrafluoride ($CF_4$) and a hydrogen-containing gas such as difluoromethane ($CH_2F_2$) are included in the etching gas, so that selective etching of the silicon nitride layer with respect to the silicon oxide layer is possible.

In particular, the substrate processing method according to the present invention can control the etch profile of the silicon nitride layer by controlling the atomic ratio of fluorine to hydrogen included in the etching gas to about 15:1 to about 35:1.

Furthermore, the substrate processing method according to the present invention can increase the plasma efficiency of the etching gas by controlling the RF frequency for plasma etching in the range of about 15 MHz or more and less than about 60 MHz, so that radicals can sufficiently reach the lowermost nitride layer.

Effects of the present invention are not limited to the effects mentioned above, and other effects not mentioned will be clearly understood by those skilled in the art from the detailed description below.

DETAILED DESCRIPTION OF EXEMPLARY EMBODIMENTS

Advantages and features of the present invention and methods of achieving them will become apparent with reference to the embodiments described below in detail in conjunction with the accompanying drawings. However, the present invention is not limited to the embodiments disclosed below, but may be embodied in various different forms, the embodiments merely serve to complete the disclosure of the present invention and to fully inform the scope of the invention to those skilled in the art to which the invention pertains, and the present invention is defined only by the scope of the claims. Throughout the specification the same reference numerals refer to the same components. The sizes and relative sizes of layers and regions in the drawings may be exaggerated for clarity of description.

When an element or layer is referred to as being "above" or "on" another element or layer, it includes a case of being directly on the other element or layer as well a case of another layer or element interposed therebetween. On the other hand, a device referred to as "directly on" or "directly above" indicates that there is not another device or layer interposed therebetween. In addition, where a component is described as being "connected," "coupled," or "connected" to another component, it is to be understood that the components may be directly coupled or connected to one another, but that other components are "interposed" between each component, or that each component may be "connected," "coupled," or "coupled" through another component.

The spatially relative terms "below," "lower," "above," "upper" and the like can be used to readily describe the correlation between one element or elements and another element or elements as shown in the figures. A spatially relative term should be understood to include different directions of the element in use or operation in addition to the directions shown in the figures. For example, when the device shown in the figures is turned over, the device described as "below" another device may be "above" the other device. Accordingly, the exemplary term "below" may include both directions below and above.

The terminology used herein is for the purpose of describing the embodiments, and thus is not intended to limit the present invention. In this specification, the singular also includes the plural, unless specifically stated otherwise in the phrase. As used herein, "comprises" and/or "comprising" does not exclude the presence or addition of one or more other components, steps, actions and/or elements in the recited elements, steps, actions and/or elements.

Hereinafter, with reference to the accompanying drawings, the substrate processing method according to a preferred embodiment of the present invention will be described in detail.

Figure 1:
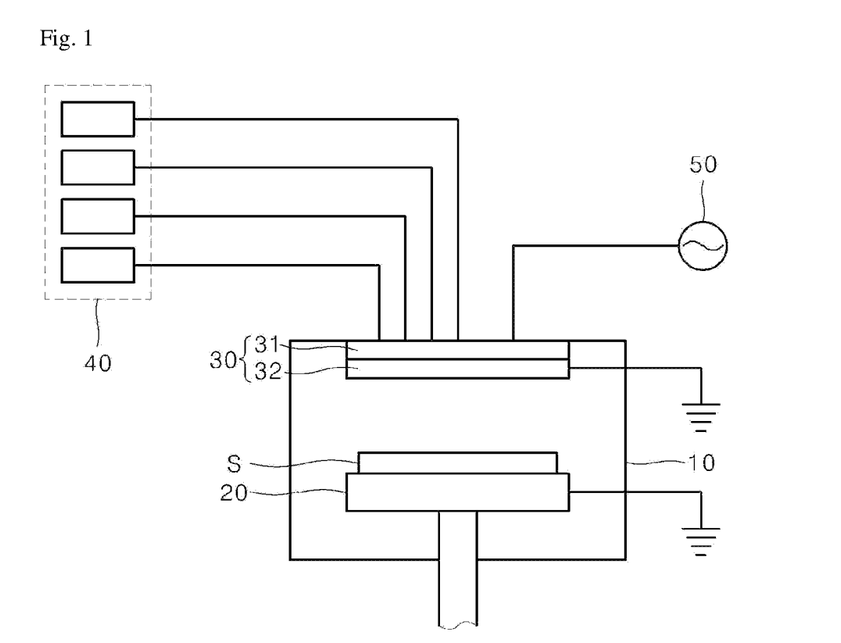
FIG. 1 schematically shows an example of an etching device that can be used in the present invention.

FIG. 1 schematically shows an example of an etching device that can be used in the substrate processing method according to the present invention.

Referring to FIG. 1, the illustrated etching device includes a chamber 10, a susceptor 20, a shower head 30, a plurality of gas sources 40, and an RF power source 50.

The susceptor 20 is disposed at the lower side inside the chamber 10, and the shower head 30 is disposed at the upper side inside the chamber 10.

The substrate S to be processed is disposed on the susceptor 20. The susceptor 20 may be provided with a temperature control means such as a hot wire or a coolant line. Also, the susceptor 20 may be connected to the ground.

The shower head 30 is disposed at the upper side inside the chamber 10. The shower head 30 serves to distribute and supply a reaction gas into the chamber 10. In addition, the shower head 30 may serve as an RF electrode so that plasma is formed inside the shower head or plasma is formed in a space between the shower head and the susceptor. For example, when forming plasma inside the shower head 30, the upper part 31 of the shower head 30 is connected to the RF power source 50 to serve as an RF electrode, and the lower part 32 of the shower head may be connected to the ground to serve as a ground electrode.

The plurality of gas supply sources 40 are disposed outside the chamber 10, and supply a plurality of gases including a fluorine-containing gas into the chamber 10. For substrate processing, a plurality of gases including a fluorine-containing gas are provided into the chamber 10 from a plurality of gas sources 40 through the shower head 30. A flow rate controller for adjusting the flow rate of each gas may be disposed between the plurality of gas supply sources 40 and the chamber 10. The plurality of gases may be pre-mixed outside the chamber and supplied to the shower head 30, or may be mixed inside the shower head 30.

The RF power source 50 may apply power having a predetermined RF frequency (for example, 27.12 MHz, 50 MHz, etc.). After supplying a plasma ignition gas or a plurality of gases to the inside of the chamber 10, for example, the inside of the shower head, RF power (e.g., high frequency power) having a predetermined RF frequency in the RF power source 50 is applied to the upper part 31 of the shower head serving as an electrode to form a plasma inside the showerhead 30. Forming a plasma may refer to the gas supplied into the chamber being converted into a plasma state, that is, plasmaized.

A substrate processing method according to an embodiment of the present invention includes disposing a substrate and etching a silicon nitride layer.

In step of disposing a substrate, a substrate having one or more silicon oxide layers and two or more silicon nitride layers formed thereon is placed on the susceptor in the chamber.

Figure 2A:
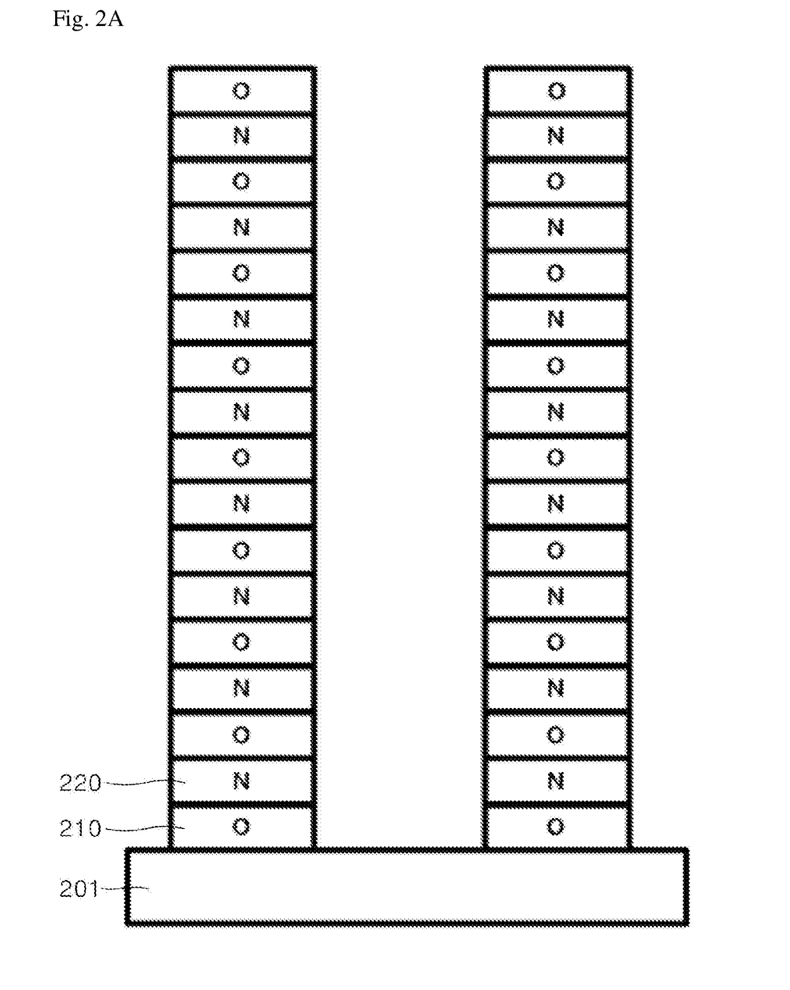
FIG. 2A shows an example of a substrate to be etched that can be used in the present invention.

FIG. 2A shows an example of a substrate to be etched that can be used in the present invention.

Referring to FIG. 2A, the substrate may be a silicon wafer 201 on which a silicon oxide layer 210 and a silicon nitride layer 220 are alternately stacked. The silicon oxide layer 210 and the silicon nitride layer 220 may be formed of 9 layers and 8 layers, respectively, as illustrated in FIG. 2A, but is not limited thereto.

In step of etching a silicon nitride layer, a plurality of gases are supplied into the chamber to selectively etch two or more silicon nitride layers.

Figure 2B:
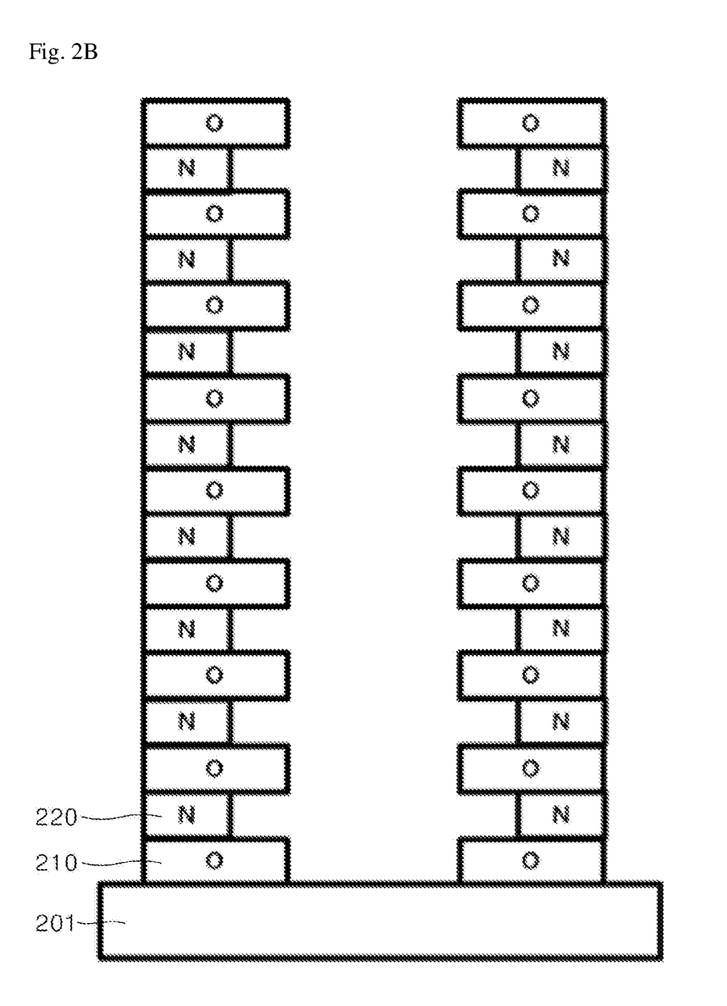
FIG. 2B shows an example in which the lowermost silicon nitride layer to the uppermost silicon nitride layer are etched at the same etch rate.
Figure 2C:
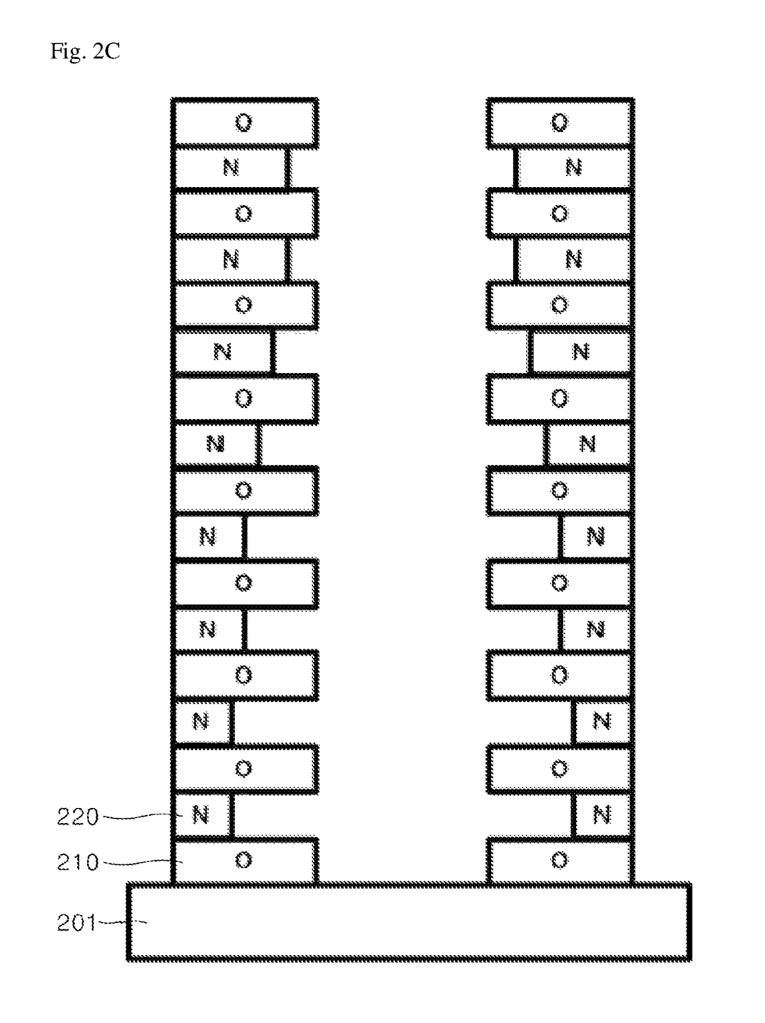
FIG. 2C shows an example of etching with an etch rate that gradually increases from the uppermost silicon nitride layer to the lowermost silicon nitride layer.
Figure 2D:
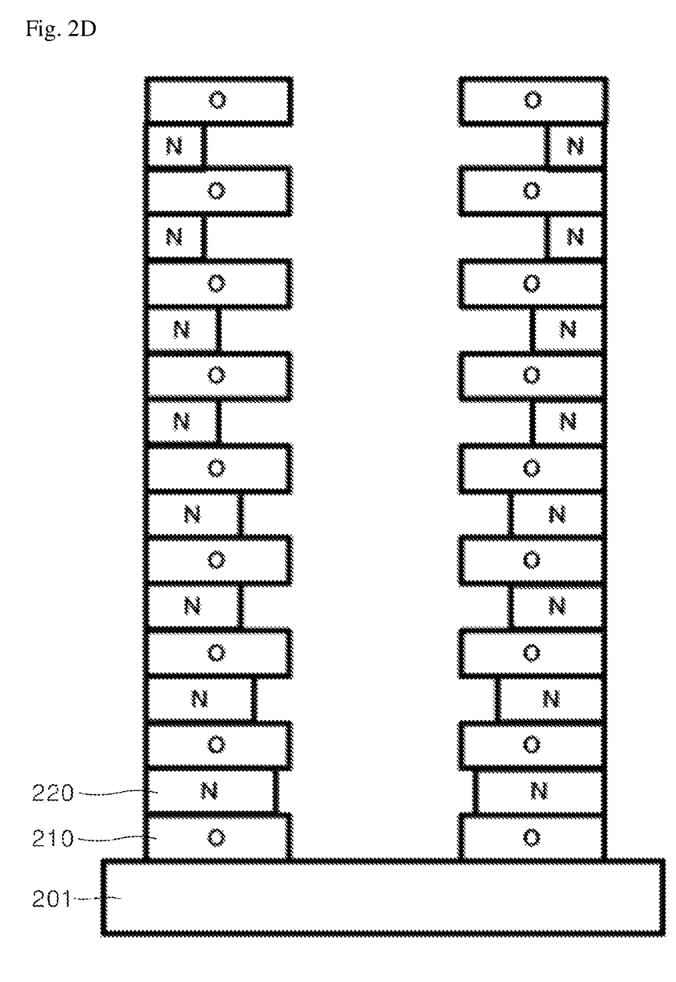
FIG. 2D shows an example of etching with an etch rate that gradually decreases from the uppermost silicon nitride layer to the lowermost silicon nitride layer.

FIG. 2B shows an example in which the lowermost silicon nitride layer to the uppermost silicon nitride layer are etched at the same etch rate. FIG. 2C shows an example of etching with an etch rate that gradually increases from the uppermost silicon nitride layer to the lowermost silicon nitride layer. FIG. 2D shows an example of etching with an etch rate that gradually decreases from the uppermost silicon nitride layer to the lowermost silicon nitride layer.

The etch profile of the silicon nitride layer may vary as in the examples shown in FIGS. 2B to 2D. In particular, it may be necessary to etch at the same etch rate from the uppermost silicon nitride layer to the lowermost silicon nitride layer as in the example shown in FIG. 2B, or to gradually increase the etch rate toward the lowermost silicon nitride layer as in the example shown in FIG. 2C.

In the present invention, a gas containing hydrogen and a gas containing fluorine are included in the etching gas as follows, and the etch profile is adjusted by adjusting the atomic ratio of fluorine to hydrogen.

First, for selective etching of a silicon nitride layer, a plurality of gases are supplied into the chamber in the present invention. The plurality of gases include a first gas containing fluorine (F) and a second gas containing hydrogen (H).

Meanwhile, in the present invention, it is preferable that nitrogen trifluoride ($NF_3$) is excluded from the first gas. In the case of nitrogen trifluoride ($NF_3$), since it etches not only the silicon nitride layer but also the silicon oxide layer to some extent, it is preferable to be excluded as much as possible from the plurality of gases for the selective etching of the silicon nitride layer.

In the present invention, the first gas and the second gas become plasma inside a chamber, for example, inside a shower head.

As a process condition for plasma etching, it is preferable that high frequency power having an RF frequency of about 15 MHz or more and less than about 60 MHz from the RF power source of the etching device is applied to the shower head, and more preferably an RF frequency of about 15 to about 50 MHz. When the RF frequency is less than about 15 MHz, such as 13.56 MHz, ionization and decomposition efficiency of a plurality of gases is low, and therefore most of the etching radicals are consumed in the silicon nitride layer(s) on the upper side. Therefore, when the RF frequency is less than about 15 MHz, it is difficult to properly etch the silicon nitride layer(s) on the lower side, and the RF frequency is preferably about 15 MHz or more because damage such as pattern collapse can occur due to over-etching of the upper side silicon nitride layer. Meanwhile, when the RF frequency is about 60 MHz or higher, such as 67.8 MHz, it may be difficult to obtain a desired etch profile even through adjustment of other process conditions due to excessive ionization and decomposition efficiency.

In addition, the plasma mode used in the present invention is more preferably a CCP mode among an inductively coupled plasma (ICP) mode or a capacitively coupled plasma (CCP) mode. This is because, in the case of the CCP mode, the uniformity is superior to that of the ICP mode, so that a more uniform process result of the device can be obtained in large-capacity substrate processing.

In addition, although RF power of about 700 to about 2500 W, a process pressure of about 0.3 to about 10 Torr, and a susceptor surface temperature of about 0 to about 50° C. may be suggested as process conditions for plasma etching, they are not limited thereto, and various known process conditions may be applied.

It is preferable that the atomic ratio of fluorine to hydrogen (F/H) contained in the plurality of gases is about 15:1 to about 35:1. The atomic ratio of fluorine to hydrogen (F/H) can be achieved by controlling the flow rates of the fluorine-containing gas and the hydrogen-containing gas.

When the atomic ratio of fluorine to hydrogen (F/H) is less than about 15:1, hydrogen is excessively present, so that a plasma-derived polymer film is thickly formed on the surfaces of the silicon oxide layer and the silicon nitride layer, and thus the etch rate of the silicon nitride layer may be greatly reduced. Conversely, when the atomic ratio of fluorine to hydrogen (F/H) exceeds about 35:1, the polymer film is formed too thin due to the lack of hydrogen, and accordingly the etch rate of the silicon oxide film increases, thereby damaging the pattern.

The first gas may be carbon tetrafluoride ($CF_4$). The second gas may be one or more selected from difluoromethane ($CH_2F_2$), monofluoromethane ($CH_3F$), methane ($CH_4$), hydrogen ($H_2$), ammonia ($NH_3$), and trifluoromethane ($CHF_3$). More preferably, the first gas is carbon tetrafluoride ($CF_4$), and the second gas is difluoromethane ($CH_2F_2$). The flow rate of the first gas may be set to about 800 sccm or less, and the flow rate of the second gas may be set to about 200 sccm or less, but are not limited thereto.

Meanwhile, the plurality of gases may further include nitrogen and oxygen. Nitrogen binds to NO and contributes to etching the silicon nitride layer. Oxygen also contributes to the removal of process by-products. Nitrogen may be supplied into the chamber at a flow rate of, for example, about 2000 sccm or less, and oxygen may be supplied into the chamber at a flow rate of, for example, about 3000 sccm or less.

After the selective etching of the silicon nitride layer, a heat treatment for removing the condensed film formed on the surface of the silicon nitride layer during the etching process may be performed. Heat treatment may be performed in a temperature range of about 80 to about 300° C.

EXAMPLES

Hereinafter, the configuration and actions of the present invention will now be described in more detail by way of preferred embodiments of the invention. However, these are given as preferred examples of the present invention and cannot be construed as limiting the invention in any sense. Content not described here will be omitted because it can be technically inferred sufficiently by those skilled in the art.

A substrate similar to the example shown in FIG. 2A was prepared. Silicon oxide layers 210 (O) and silicon nitride layers 220 (N) were alternately stacked on the silicon wafer 201. The silicon nitride layers 220 (N) were formed in a total of eight layers. The silicon oxide layer 210 (O) was formed by thermal oxidation.

As the etching gas, carbon tetrafluoride ($CF_4$) and difluoromethane ($CH_2F_2$) were used, and the flow rate was controlled so that the atomic ratio of fluorine to hydrogen (F/H) in Table 1 was obtained. In addition, the following process conditions were applied:
RF frequency of RF power source: 27.12 MHz
RF power of RF power source: 1000 W
Plasma Mode: CCP mode
Chamber internal pressure: 1 Torr
Susceptor surface temperature: room temperature Table 1 shows the SiN etch rate, SiN selectivity, and T/B ratio indicating the etch rate of the uppermost silicon nitride layer compared to the lowermost silicon nitride layer according to the atomic ratio of fluorine to hydrogen (F/H).

In Table 1, the SiN etch rate and $SiO_2$ etch rate are values obtained through unpatterned wafer process results.

In addition, the T/B ratio represents the etch rate of the uppermost silicon nitride layer compared to the lowermost silicon nitride layer. When the T/B ratio is 1, the etch rates of the lowermost silicon nitride layer and the uppermost silicon nitride layer are the same. When the T/B ratio is greater than 1, the uppermost silicon nitride layer is etched more than the lowermost silicon nitride layer. Conversely, when the T/B ratio is less than 1, the lowermost silicon nitride layer is etched more than the uppermost silicon nitride layer.

TABLE 1

| F/H (Atomic ratio) | SiN etch rate | $SiO_2$ etch rate | T/B ratio |
| --- | --- | --- | --- |
| 12:1 | Lowermost silicon nitride layer is not etched | | ∞ |
| 15:1 | 4.0 | 0.04 | 2.6 |
| 18:1 | 4.1 | 0.04 | 2.3 |
| 22.5:1 | 4.2 | 0.04 | 1.0 |
| 25:1 | 4.2 | 0.04 | 0.75 |
| 30:1 | 4.3 | 0.04 | 0.55 |
| 35:1 | 4.4 | 0.05 | 0.75 |
| 38:1 | Pattern collapses occurs | | 0.9 |

Referring to Table 1, when the atomic ratio of fluorine to hydrogen (F/H) is less than 15:1, it can be seen that the lowermost silicon nitride layer is hardly etched. The fact that the atomic ratio of fluorine to hydrogen (F/H) is less than 15:1 means that the hydrogen ratio is relatively high compared to other examples. As the hydrogen ratio is very high, a plasma-derived polymer film is formed very thickly on the surfaces of the silicon oxide layer and the silicon nitride layer during plasma etching, so that the silicon nitride layer is hardly etched. Therefore, it is preferable that the atomic ratio of fluorine to hydrogen (F/H) is 15:1 or more.

In addition, referring to Table 1, when the atomic ratio of fluorine to hydrogen (F/H) exceeds 35:1, it can be seen that pattern collapse occurs. As the hydrogen ratio is very low, a thin polymer film is formed on the surface of the silicon oxide layer and the silicon nitride layer, and accordingly, the etching amount of the silicon oxide layer is also greatly increased, resulting in pattern collapse. Therefore, it is preferable that the atomic ratio of fluorine to hydrogen (F/H) is about 35:1 or less.

Figure 3:
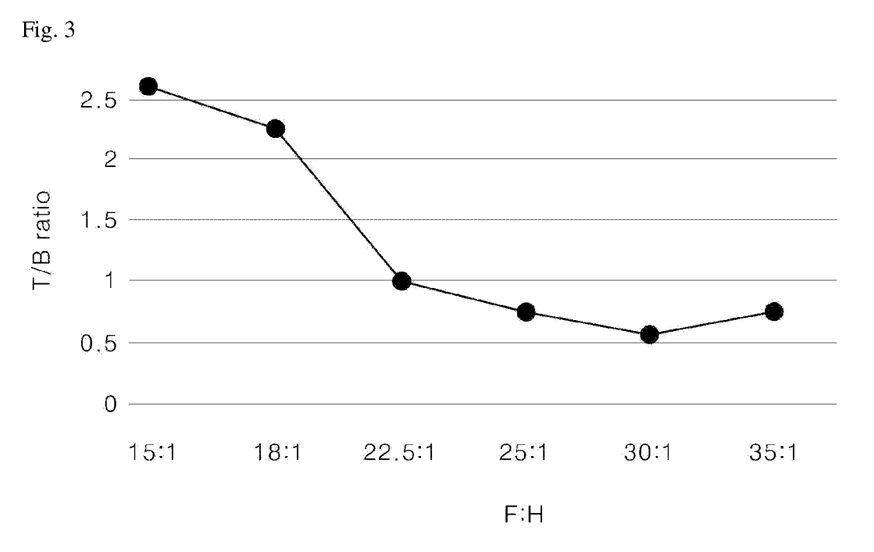
FIG. 3 shows the relative etch rates of the uppermost silicon nitride layer and the lowermost silicon nitride layer according to the atomic ratio of fluorine to hydrogen included in the etching gas.

FIG. 3 shows the relative etch rates of the uppermost silicon nitride layer and the lowermost silicon nitride layer according to the atomic ratio of fluorine to hydrogen included in the etching gas.

Referring to Table 1 and FIG. 3, when the atomic ratio of fluorine to hydrogen (F/H) is 15:1, the T/B ratio representing the etch rate of the uppermost silicon nitride layer compared to the lowermost silicon nitride layer was about 2.6, and when the atomic ratio of fluorine to hydrogen (F/H) was 18:1, the T/B ratio was about 2.3. This may be useful when it is necessary to relatively gradually lower the etch rate toward the lowermost silicon nitride layer as shown in FIG. 2D.

In addition, when the atomic ratio of fluorine to hydrogen (F/H) was 22.5:1, the T/B ratio was about 1.0, which may be useful when it is necessary to make the etch rates of the uppermost silicon nitride layer and the lowermost silicon nitride layer uniform as shown in FIG. 2B.

In addition, when the atomic ratios (F/H) of fluorine to hydrogen were 25:1, 30:1, and 35:1, the T/B ratio was less than 1.0, which may be useful when it is necessary to make gradually increase the etch rate toward the lowermost silicon nitride layer as shown in FIG. 2C.

In addition, it can be seen that the T/B ratio decreases until the atomic ratio of fluorine to hydrogen (F/H) increases from 25:1 to 30:1, but the T/B ratio rather increases as the atomic ratio of fluorine to hydrogen (F/H) increases from 30:1 to 35:1.

As described above, according to the substrate processing method according to the present invention, it is possible to obtain an effect that the etch profile of the silicon nitride layer formed on the substrate can be adjusted through the control of the atomic ratio of fluorine to hydrogen contained in the etching gas, while enabling the selective etching of the layer of silicon nitride with respect to the silicon oxide layer.

In particular, by controlling the atomic ratio of fluorine to hydrogen (F:H) to about 22.5:1 or more and about 35:1 or less, it is possible to uniformly etch the multilayer silicon nitride layers from the top silicon nitride layer to the lowermost silicon nitride phase, or to gradually etch more and more from the uppermost silicon nitride to the lowermost silicon nitride, thereby obtaining an etch profile as shown in FIG. 2B or 2C.

On the other hand, by controlling the atomic ratio of fluorine to hydrogen (F/H) to about 15:1 or more and less than about 22.5:1, the amount of etching can be gradually reduced from the uppermost silicon nitride layer to the lowermost silicon nitride layers, and an etch profile as shown in FIG. 2D can be obtained.

Meanwhile, even when the RF frequency was fixed at about 50 MHZ, T/B ratio results similar to those in Table 1 were obtained by adjusting the atomic ratio of fluorine to hydrogen (F/) to about 15:1 to about 35:1.

On the other hand, when the RF frequency was fixed at about 60 MHZ, the thickness direction profile of the silicon nitride layers could not be adjusted even if the process recipe was changed with various RF powers and pressures. This seems to be due to excessive ionization and decomposition efficiency during plasma etching. Therefore, from these results, it can be seen that the RF frequency applied to the substrate processing method according to the present invention is more preferably less than about 60 MHz.

Although the above description has been focused on the embodiments of the present invention, various changes or modifications may be made at the level of those skilled in the art. Such changes and modifications can be said to belong to the present invention without departing from the scope of the present invention. Accordingly, the scope of the present invention should be judged by the claims described below.

What is claimed is:

1. A substrate processing method for selectively etching a silicon nitride layer above a substrate comprising alternating layers of silicon oxide layer and silicon nitride layer stacked, the method comprising:
   plasma etching the silicon nitride layers using plasma of a plurality of gases;
   wherein the plurality of gases include a first gas containing fluorine excluding nitrogen trifluoride ($NF_3$) and a second gas containing hydrogen, and
   wherein the etch profile in the thickness direction of the silicon nitride layers is controlled by adjusting the atomic ratio of fluorine to hydrogen included in the plurality of gases.

2. The method of claim 1, wherein the atomic ratio of fluorine to hydrogen (F/H) is about 15:1 to 35:1.

3. The method of claim 1, wherein
   the first gas is carbon tetrafluoride ($CF_4$), and
   the second gas is one or more selected from the group consisting of difluoromethane ($CH_2F_2$), monofluoromethane ($CH_3F$), methane ($CH_4$), hydrogen ($H_2$), ammonia ($NH_3$) and trifluoromethane ($CHF_3$).

4. The method of claim 1, wherein the plurality of gases further comprise nitrogen and oxygen.

5. The method of claim 1, wherein the plasma etching is performed under a condition of a RF frequency range of about 15 MHz to about 60 MHz.

6. The method of claim 1, wherein the plasma etching is performed in a capacitively coupled plasma (CCP) mode.

7. A substrate processing method for selectively etching a silicon nitride layer above a substrate comprising alternating layers of silicon oxide layer and silicon nitride layer stacked, the method comprising:
   plasma etching the silicon nitride layers using plasma of a plurality of gases such that the etch rate of the uppermost silicon nitride layer and that of the lowermost silicon nitride group are the same or the etch rate gradually increases from the uppermost to the lowermost layer of silicon nitride,
   wherein the plurality of gases include a first gas containing fluorine excluding nitrogen trifluoride and a second gas containing hydrogen, and
   wherein an atomic ratio of fluorine to hydrogen (F/H) contained in the plurality of gases is about 22.5:1 or more and about 35:1 or less.

8. The method of claim 7, wherein
   the first gas is carbon tetrafluoride ($CF_4$), and
   the second gas is one or more selected from the group consisting of difluoromethane ($CH_2F_2$), monofluoromethane ($CH_3F$), methane ($CH_4$), hydrogen ($H_2$), ammonia ($NH_3$) and trifluoromethane ($CHF_3$).

9. The method of claim 7, wherein the plurality of gases further comprise nitrogen and oxygen.

10. The method of claim 7, wherein the plasma etching is performed under a condition of a RF frequency of about 15 MHz or more and less than about 60 MHz.

11. A substrate processing method for selectively etching a silicon nitride layer above a substrate comprising alternating layers of silicon oxide layer and silicon nitride layer stacked, the method comprising:
    plasma etching the silicon nitride layers using plasma of a plurality of gases such that the etch rate gradually decreases from the uppermost silicon nitride layer to the lowermost silicon nitride layer;
    wherein the plurality of gases include a first gas containing fluorine excluding nitrogen trifluoride and a second gas containing hydrogen, and
    wherein an atomic ratio of fluorine to hydrogen (F/H) contained in the plurality of gases is about 15:1 or more and less than about 22.5:1.

12. The method of claim 11, wherein
    the first gas is carbon tetrafluoride ($CF_4$), and
    the second gas is one or more selected from the group consisting of difluoromethane ($CH_2F_2$), monofluoromethane ($CH_3F$), methane ($CH_4$), hydrogen ($H_2$), ammonia ($NH_3$) and trifluoromethane ($CHF_3$).

13. The method of claim 11, wherein the plurality of gases further comprise nitrogen and oxygen.

14. The method of claim 11, wherein the plasma etching is performed under a condition of a RF frequency of about 15 MHz or more and less than about 60 MHz.

* * * * *